United States Patent
Campbell

(10) Patent No.: US 7,332,735 B2
(45) Date of Patent: Feb. 19, 2008

(54) PHASE CHANGE MEMORY CELL AND METHOD OF FORMATION

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 11/194,623

(22) Filed: Aug. 2, 2005

(65) Prior Publication Data

US 2007/0029537 A1 Feb. 8, 2007

(51) Int. Cl.
*H01L 29/26* (2006.01)
(52) U.S. Cl. .................. 257/5; 257/2; 257/E29.08; 365/163
(58) Field of Classification Search .............. 257/2, 257/5, E29.08; 365/163
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |

(Continued)

FOREIGN PATENT DOCUMENTS

JP 5-6126916 10/1981

(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

(Continued)

*Primary Examiner*—Thomas Dickey
*Assistant Examiner*—Victor A. Mandala, Jr.
(74) *Attorney, Agent, or Firm*—Dickstein Shapiro LLP

(57) ABSTRACT

A phase change memory element and methods for forming the same are provided. The memory element includes a first electrode and a chalcogenide comprising phase change material layer over the first electrode. A metal-chalcogenide layer is over the phase change material layer. The metal chalcogenide layer is tin-telluride. A second electrode is over the metal-chalcogenide layer. The memory element is configured to have reduced current requirements.

39 Claims, 3 Drawing Sheets

U.S. PATENT DOCUMENTS

| | | | |
|---|---|---|---|
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | |
| 4,800,526 A | 1/1989 | Lewis | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Sliwa et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,296,716 A | 3/1994 | Ovshinsky et al. | |
| 5,314,772 A | 5/1994 | Kozicki et al. | |
| 5,315,131 A | 5/1994 | Kishimoto et al. | |
| 5,335,219 A | 8/1994 | Ovshinsky et al. | |
| 5,341,328 A | 8/1994 | Ovshinsky et al. | |
| 5,350,484 A | 9/1994 | Gardner et al. | |
| 5,359,205 A | 10/1994 | Ovshinsky | |
| 5,360,981 A | 11/1994 | Owen et al. | |
| 5,363,329 A * | 11/1994 | Troyan | 365/184 |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,920,788 A | 7/1999 | Reinberg | |
| 5,933,365 A | 8/1999 | Klersy et al. | |
| 5,998,066 A | 12/1999 | Block et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,087,674 A | 7/2000 | Ovshinsky et al. | |
| 6,117,720 A | 9/2000 | Harshfield | |
| 6,141,241 A | 10/2000 | Ovshinsky et al. | |
| 6,143,604 A | 11/2000 | Chiang et al. | |
| 6,177,338 B1 | 1/2001 | Liaw et al. | |
| 6,236,059 B1 | 5/2001 | Wolsteinholme et al. | |
| RE37,259 E | 7/2001 | Ovshinsky | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,339,544 B1 | 1/2002 | Chiang et al. | |
| 6,348,365 B1 | 2/2002 | Moore et al. | |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,404,665 B1 | 6/2002 | Lowery et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,671,710 B2 | 12/2003 | Ovshinsky et al. | |
| 6,673,648 B2 | 1/2004 | Lowery | |
| 6,673,700 B2 | 1/2004 | Dennison et al. | |
| 6,674,115 B2 | 1/2004 | Hudgens et al. | |
| 6,687,153 B2 | 2/2004 | Lowery | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,707,712 B2 | 3/2004 | Lowery | |
| 6,714,954 B2 | 3/2004 | Ovshinsky et al. | |

| | | | |
|---|---|---|---|
| 7,061,013 B2 * | 6/2006 | Hideki | 257/42 |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Kozicki | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |
| 2005/0032319 A1 | 2/2005 | Dodge | |
| 2005/0062087 A1 | 3/2005 | Chen et al. | |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell* (PMC), pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) 17$^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L. , Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism; J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metallurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ ($0 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shernetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell,A.J. ;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G. ;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H. ;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sle, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2. 4), J. Non-Cryst. Solids 151 (1992) 149-154.

Lankhorst, Martijn H.R., Low-cost and nanoscale non-volatile memory concept for future silicon chips, Nature Materials, vol. 4, Apr. 2005, pp. 347-352.

International Search Report with Written Opinion dated Dec. 15, 2006.

\* cited by examiner

PHASE CHANGE MEMORY CELL AND METHOD OF FORMATION

FIELD OF THE INVENTION

The present invention relates to semiconductor devices, and in particular phase-change memory devices and method of forming the same.

BACKGROUND OF THE INVENTION

Non-volatile memories are important elements of integrated circuits due to their ability to maintain data absent a power supply. Phase change materials have been investigated for use in non-volatile memory cells. Phase change memory cells include phase change materials, such as chalcogenide alloys, which are capable of stably transitioning between amorphous and crystalline phases. Each phase exhibits a particular resistance state and the resistance states distinguish the logic values of the memory cell. Specifically, an amorphous state exhibits a relatively high resistance, and a crystalline state exhibits a relatively low resistance.

A typical phase change cell has a layer of phase change material between first and second electrodes. As an example, the phase change material is a chalcogenide alloy, such as $Ge_2Sb_2Te_5$ or SbTeAg. See, e.g., Lankhorst et al., *Low-cost and nanoscale non-volatile memory concept for future silicon chips*, NATURE MATERIALS, vol. 4 pp. 347-352 (April 2005).

A portion of the phase change material is set to a particular resistance state according to the amount of current applied via the electrodes. To obtain an amorphous state, a relatively high write current pulse (a reset pulse) is applied through the phase change cell to melt a portion of the material for a short period of time. The current is removed and the cell cools rapidly to below the glass transition temperature, which results in the portion of the material having an amorphous phase. To obtain a crystalline state, a lower current write pulse (a set pulse) is applied to the phase change cell for a longer period of time to heat the material to below its melting point. This causes the amorphous portion of the material to re-crystallize to a crystalline phase that is maintained once the current is removed and the cell 10 is rapidly cooled.

A sought after characteristic of non-volatile memory is low power consumption. Often, however, phase change memory cells require large operating currents. It would therefore be desirable to provide a phase change memory cell with reduced current requirements.

BRIEF SUMMARY OF THE INVENTION

Embodiments of the invention provide a phase change memory element and methods for forming the same. The memory element includes a first electrode and a chalcogenide comprising phase change material layer over the first electrode. A metal-chalcogenide layer is over the phase change material layer. The metal chalcogenide layer comprises tin-telluride-telluride. A second electrode is over the metal-chalcogenide layer. The memory element is configured to have reduced power consumption.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

Figure 1:
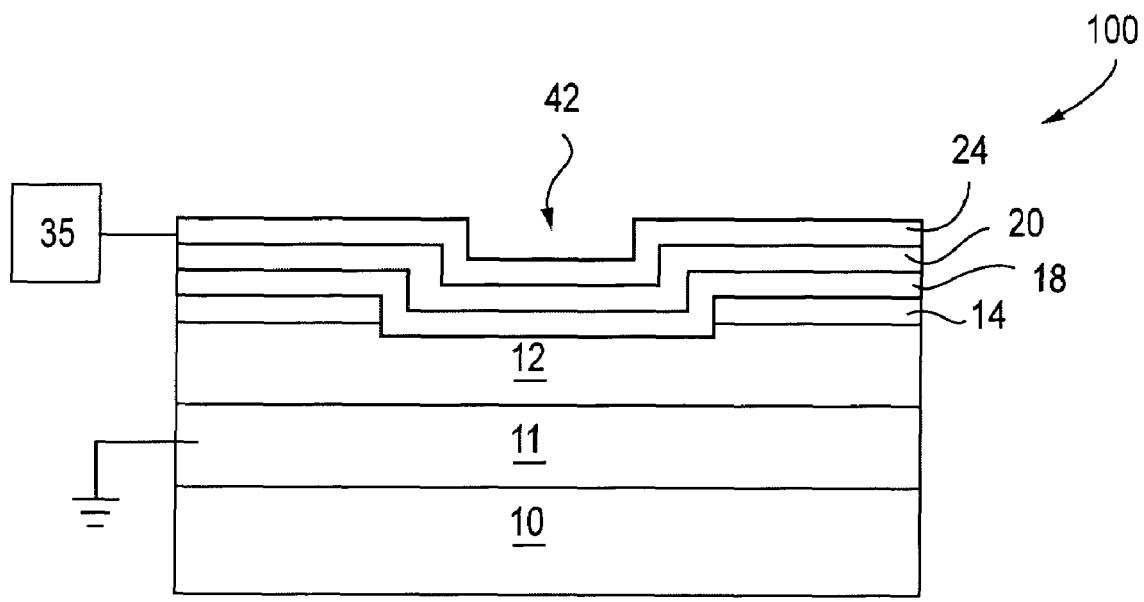
FIG. 1 depicts a phase change memory element according to an embodiment of the invention.

The invention is now explained with reference to the figures, which illustrate exemplary embodiments and throughout which like reference numbers indicate like features. FIG. 1 depicts an exemplary embodiment of a memory element 100 constructed in accordance with the invention. The device 100 shown in FIG. 1 is supported by a substrate 10. Over the substrate is a first insulating layer 11. A first electrode 21 overlies the first insulating layer 11 and substrate 10. The first electrode 12 can be any suitable conductive material, and is tungsten (W) in the illustrated embodiment.

A second insulating layer 14 is over the first electrode 12. A via 42 is within the insulating layer 14 to expose a portion of the first electrode 12. In the illustrated embodiment, the via 42 extends through a portion of the first electrode 12. The second insulating layer 14 can be a nitride, such as silicon nitride ($Si_3N_4$); a low dielectric constant material; an insulating glass; an insulating polymer; among other materials.

As shown in FIG. 1, a layer 18 of phase change material, specifically a chalcogenide material layer 18 is deposited within the via 42 and over the first electrode 12. In the illustrated embodiment, the layer 18 is a germanium-telluride layer. Other exemplary chalcogenide compositions for the layer 18 include concentrations of Te below about 70%. The germanium concentration is preferably above about 10%. The layer 18 can include additional elements, for example antimony. The percentages given are atomic percentages which total 100% of the atoms of the constituent elements. In the illustrated example, the germanium-telluride layer 18 is about 300 Å thick and in electrical contact with the underlying first electrode 12, but less than about 100 Å thick at the edges 42a of the via 42 adjacent the underlying first electrode 12. Over the germanium-telluride layer 18 and within the via 42 is a tin-telluride layer 20. In the illustrated embodiment, the layer 20 is about 50% tin and about 50% tellurium and is about 500 Å thick.

Although layer 20 is shown over the chalcogenide material layer 18, it should be understood that the orientation of the layers can be altered. For example, the chalcogenide material layer 18 may be over the layer 20.

Over the tin-telluride layer 20 and within the via 42 is a second electrode 24. The second electrode 24 can be any suitable conductive material, and is tungsten in the illustrated embodiment.

For operation, a pulse generator 35 is used to apply a reset pulse of about 1.4 V, and a current of less than or about 280 µA is used. The reset pulse melts at least a portion of the germanium-telluride layer 18 leaving the layer 18 in a high resistance, amorphous state. A set pulse of about 1.17 V, and a current of less than or about 200 µA is used. The set pulse crystallizes at least a portion of the tellurium layer 18 leaving the layer 18 in a low resistance state.

Figure 2A:
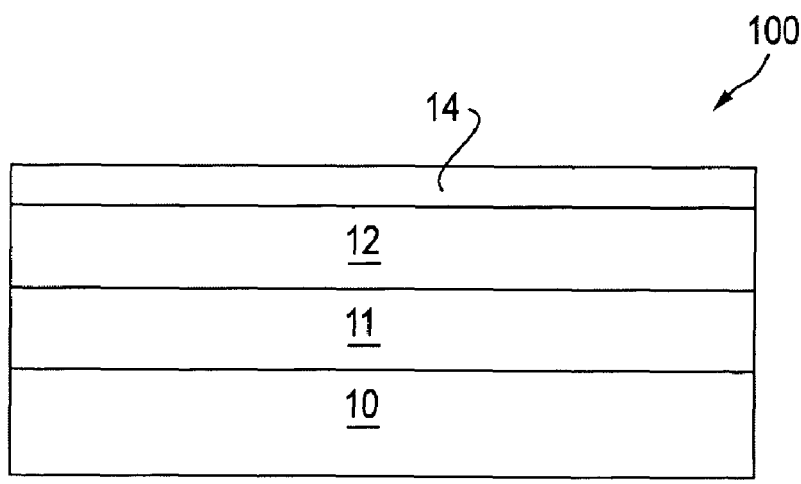
FIGS. 2A-2C depict the formation of the memory elements of FIG. 1 at different stages of processing.
Figure 2B:
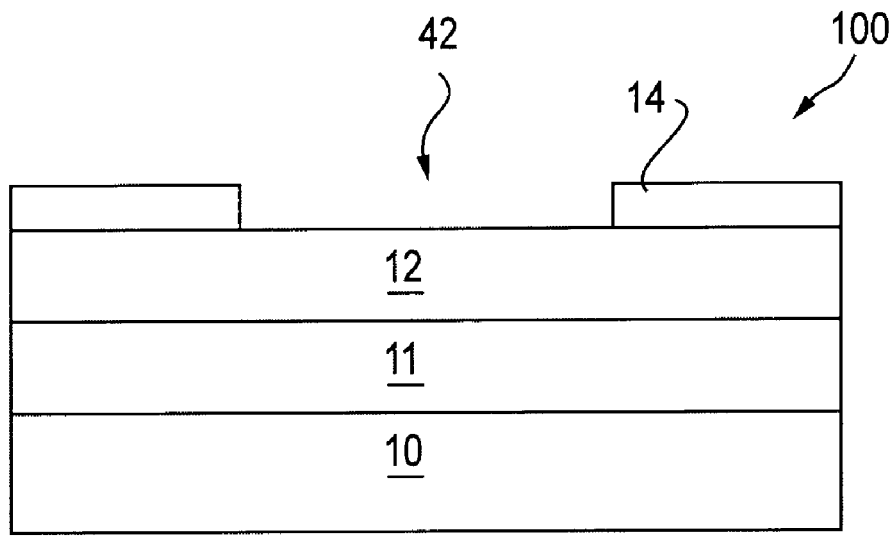
Figure 2C:
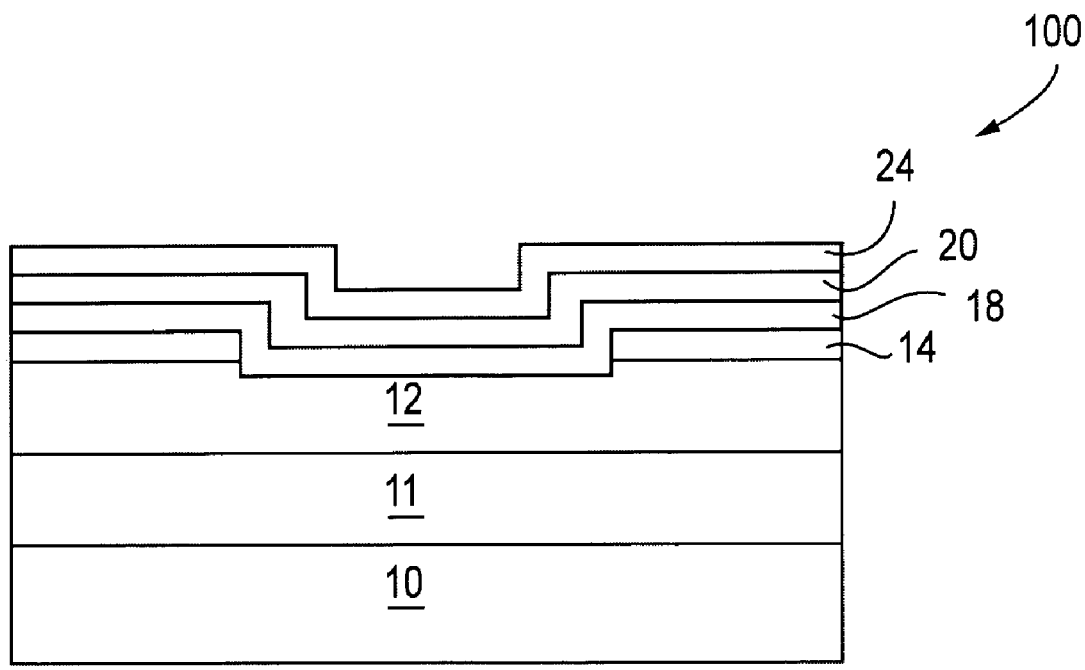

FIGS. 2A-2C are cross sectional views of a wafer depicting the formation of the memory element 100 according to an exemplary embodiment of the invention. No particular order is required for any of the actions described herein, except for those logically requiring the results of prior actions. Accordingly, while the actions below are described as being performed in a specific order, the order is exemplary only and can be altered if desired. Although the formation of a single memory element 100 is shown, it should be appreciated that the memory element 100 can be one memory element in an array of memory elements, which can be formed concurrently.

As shown by FIG. 2A, a substrate 10 is initially provided. As indicated above, the substrate 10 can be semiconductor-based or another material useful as a supporting structure as is known in the art. A first insulating layer 11 is formed over the substrate 10 and a first electrode 12 is formed over the insulating layer 11. A second insulating layer 14 is formed over the first electrode 12. The first insulating layer can be, for example silicon dioxide. The second insulating layer 14 can be silicon nitride, a low dielectric constant material, or other suitable insulators known in the art, and may be formed by any method known in the art.

As illustrated in FIG. 2B, a via 42 is formed, for instance by photolithographic and etching techniques, within the second insulating layer 14 to expose a portion of the first electrode 12. Optionally, the via 42 can extend partially through the first electrode 12.

As shown in FIG. 2C, a germanium-telluride layer 18 is formed over the first electrode 12 and second insulating layer 14 and within the via 42. Formation of the germanium-telluride layer 18 may be accomplished by any suitable method. The layer 18 is formed having a thickness of about 300 Å.

A tin-telluride layer 20 is formed over the germanium-telluride layer 18 and within the via 42. The layer 20 can be formed by any suitable method, e.g., physical vapor deposition, chemical vapor deposition, co-evaporation, sputtering, among other techniques. The layer 18 is formed having a thickness of about 500 Å.

A conductive material is deposited over the tin-telluride layer 20 and within the via 42 to form a second electrode 24. Similar to the first electrode 12, the conductive material for the second electrode 24 may be any material suitable for a conductive electrode, for example, tungsten. In the illustrated embodiment, the layers 18, 20, 24 are formed as blanket layers.

Additional processing steps can be performed, for example the formation of connections to other circuitry of the integrated circuit (e.g., logic circuitry, sense amplifiers, etc.) of which the memory element 100 is a part, as is known in the art.

Figure 3:
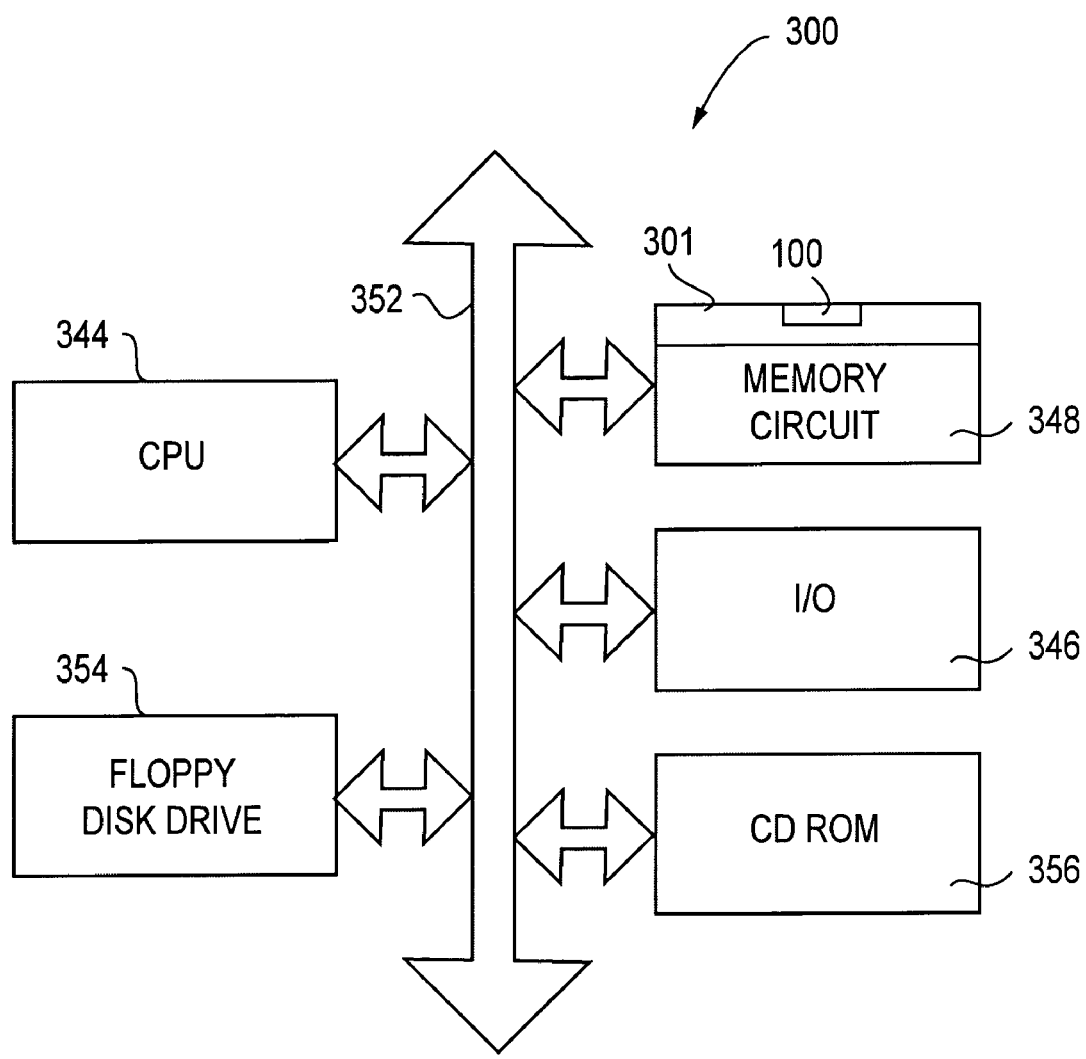
FIG. 3 is a block diagram of a system including a memory element according to an exemplary embodiment of the invention.

FIG. 3 illustrates a processor system 300 which includes a memory circuit 348, e.g., a memory device, which employs memory array 301, which includes at least one memory element 100 constructed according to the invention. The processor system 300, which can be, for example, a computer system, generally comprises a central processing unit (CPU) 344, such as a microprocessor, a digital signal processor, or other programmable digital logic devices, which communicates with an input/output (I/O) device 346 over a bus 352. The memory circuit 348 communicates with the CPU 344 over bus 352 typically through a memory controller.

In the case of a computer system, the processor system 300 may include peripheral devices such as a floppy disk drive 354 and a compact disc (CD) ROM drive 356, which also communicate with CPU 344 over the bus 352. Memory circuit 348 is preferably constructed as an integrated circuit, which includes a memory array 301 having at least one memory element 100 according to the invention. If desired, the memory circuit 348 may be combined with the processor, for example CPU 344, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory element comprising:
  a first electrode;
  an insulating material over the first electrode;
  a via within the insulating material;
  a chalcogenide comprising phase change material over the first electrode and within the via, wherein the phase change material has a thickness of less than or equal to about 100 Å at an edge of the via adjacent the first electrode;
  a metal-chalcogenide material over the phase change material and within the via; and
  a second electrode over the metal-chalcogenide layer.

2. The memory element of claim 1, wherein the memory element configured to be set to a first resistance state using a current of less than or about 200 µA.

3. The memory element of claim 1, wherein the memory element is configured to be reset to a second resistance state using a current of less than or about 280 µA.

4. The memory element of claim 1, wherein the memory element is configured to be reset to the second resistance state using a voltage of about 1.4 V.

5. The memory element of claim 4, wherein the memory element is configured to be set to the first resistance state using a voltage of about 1.17 V.

6. The memory element of claim 1, wherein the phase change material comprises germanium-telluride and the metal-chalcogenide material comprises tin-telluride.

7. The memory element of claim 1, wherein at least a portion of the phase change material has a thickness of about 300 Å.

8. The memory element of claim 1, wherein the metal-chalcogenide material has a thickness of about 500 Å.

9. The memory element of claim 1, wherein one or both of the first and second electrodes comprise tungsten.

10. A memory array comprising:
a plurality of memory elements, at least one memory element comprising:
a first electrode;
an insulating material over the first electrode;
a via within the insulating material;
a chalcogenide comprising phase change material over the first electrode and within the via, wherein the phase change material has a thickness of less than or equal to about 100 Å at an edge of the via adjacent the first electrode;
a metal-chalcogenide material over the phase change material and within the via, the metal chalcogenide material comprising tin-telluride; and
a second electrode over the metal-chalcogenide material.

11. The memory array of claim 10, wherein the memory element is configured to be set to a first resistance state using a current of less than or about 200 µA.

12. The memory array of claim 11, wherein the memory element is configured to be set to the first resistance state using a voltage of about 1.17 V.

13. The memory array of claim 10, wherein the memory element is configured to be reset to a second resistance state using a current of less than or about 280 µA.

14. The memory array of claim 13, wherein the memory element is configured to be reset to the first resistance state using a voltage of about 1.4 V.

15. The memory array of claim 10, wherein at least a portion of the phase change material has a thickness of about 300 521 .

16. The memory array of claim 10, wherein the phase change material comprises germanium-telluride.

17. The memory array of claim 10, wherein the metal-chalcogenide material has a thickness of about 500 Å.

18. The memory array of claim 10, wherein one or both of the first and second electrodes comprise tungsten.

19. A processor system comprising: a processor; and a memory device comprising a memory element, the memory element comprising: a first electrode; an insulating material over the first electrode; a via within the insulating material; a germanium-telluride material over the first electrode; a tin-telluride layer material over the germanium-telluride layer material, wherein the germanium-telluride material, and the tin-telluride material are within the via; and a second electrode over the tin-telluride material.

20. The system of claim 19, wherein the germanium-telluride material has a thickness of less than or equal to about 100 Å at an edge of the via adjacent the first electrode.

21. The system of claim 19, wherein the memory element is configured to be set to a first resistance state using a current of less than or about 200 µA.

22. The system of claim 21, wherein the memory element is configured to be set to the first resistance state using a voltage of about 1.17 V.

23. The system of claim 19, wherein the memory element is configured to be reset to a second resistance state using a current of less than or about 280 µA.

24. The system of claim 23, wherein the memory element is configured to be reset to the second resistance state using a voltage of about 1.4 V.

25. The system of claim 19, wherein at least a portion of the germanium-telluride material has a thickness of about 300 Å.

26. The system of claim 19, wherein the tin-telluride material has a thickness of about 500 Å.

27. The system of claim 19, wherein one or both of the first and second electrodes comprise tungsten.

28. A method for forming a memory element, the method comprising:
forming a first electrode;
forming an insulating layer over the first electrode;
forming a via within the insulating layer;
forming a chalcogenide comprising phase change material over the first electrode and within the via, wherein the phase change material layer is formed having a thickness of less than or equal to about 100 Å at an edge of the via adjacent the first electrode;
forming a metal-chalcogenide material over the phase change material and within the via; and
forming a second electrode over the metal-chalcogenide material.

29. The method of claim 28, wherein the memory element is formed to be set to a first resistance state using a current of less than or about 200 µA.

30. The method of claim 29, wherein the memory element is formed to be reset to a second resistance state using a current of less than or about 280 µA.

31. The method of claim 28, wherein the memory element is formed to be reset to the second resistance state using a voltage of about 1.4 V.

32. The method of claim 31, wherein the memory element is formed to be set to the first resistance state using a voltage of about 1.17 V.

33. The method of claim 28, wherein at least a portion of the phase change material is formed having a thickness of about 300 Å.

34. The method of claim 28, wherein the phase change material is formed comprising germanium-telluride and the metal-chalcogenide material is formed comprising tin-telluride.

35. The method of claim 28, wherein the metal-chalcogenide material is formed having a thickness of about 500 Å.

36. The method of claim 28, wherein one or both of the first and second electrodes are formed comprising tungsten.

37. A memory element comprising:
a first electrode;
an insulating material over the first electrode;
a via within the insulating material;
a germanium-telluride material within the via;
a tin-telluride layer over the germanium-telluride material and within the via; and
a second electrode over the tin-telluride material.

38. The memory element of claim 37, wherein at least a portion of the phase change material is formed having a thickness of about 300 Å.

39. The method of claim 37, wherein the metal-chalcogenide material is formed having a thickness of about 500 Å.

* * * * *

UNITED STATES PATENT AND TRADEMARK OFFICE
CERTIFICATE OF CORRECTION

PATENT NO. : 7,332,735 B2  Page 1 of 1
APPLICATION NO. : 11/194623
DATED : February 19, 2008
INVENTOR(S) : Campbell It is certified that error appears in the above-identified patent and that said Letters Patent is hereby corrected as shown below:

In column 5, line 37, in Claim 15, delete "521 ." and insert -- Å. --, therefor.

In column 5, line 49, in Claim 19, before "material" delete "layer".

In column 5, line 50, in Claim 19, before "material," delete "layer".

In column 5, line 55, in Claim 20, delete "Åat" and insert -- Å at --, therefor.

Signed and Sealed this

Tenth Day of June, 2008

JON W. DUDAS
*Director of the United States Patent and Trademark Office*